United States Patent
Tsai et al.

(10) Patent No.: US 6,972,372 B1
(45) Date of Patent: Dec. 6, 2005

(54) METHOD AND APPARATUS FOR STACKING ELECTRICAL COMPONENTS USING OUTER LEAD PORTIONS AND EXPOSED INNER LEAD PORTIONS TO PROVIDE INTERCONNECTION

(75) Inventors: Chen-Jung Tsai, Hsinchu (TW); Chih-Wen Lin, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/856,452

(22) Filed: May 28, 2004

(51) Int. Cl.[7] ............................................. H05K 5/06
(52) U.S. Cl. ..................... 174/52.2; 174/52.4; 257/686; 257/777
(58) Field of Search ................. 174/52.4, 686, 174/52.2; 257/686, 777

(56) References Cited

U.S. PATENT DOCUMENTS

| | | | |
|---|---|---|---|
| 5,198,888 A | 3/1993 | Sugano et al. ............. 257/686 |
| 5,394,010 A * | 2/1995 | Tazawa et al. ............. 257/686 |
| 5,677,569 A | 10/1997 | Choi et al. ............. 257/686 |
| 5,723,900 A * | 3/1998 | Kojima et al. ............. 257/666 |
| 5,723,903 A * | 3/1998 | Masuda et al. ............. 257/696 |
| 5,760,471 A | 6/1998 | Fujisawa et al. ............. 257/692 |
| 5,811,877 A * | 9/1998 | Miyano et al. ............. 257/706 |
| 5,939,779 A * | 8/1999 | Kim ............. 257/692 |
| 6,146,919 A | 11/2000 | Tandy ............. 438/106 |
| 6,188,021 B1 * | 2/2001 | Tandy ............. 174/52.4 |
| 6,190,944 B1 | 2/2001 | Choi ............. 438/109 |
| 6,424,030 B2 * | 7/2002 | Masayuki et al. ............. 257/685 |
| 6,459,148 B1 * | 10/2002 | Chun-Jen et al. ............. 257/692 |
| 6,723,585 B1 * | 4/2004 | Tu et al. ............. 438/123 |

* cited by examiner

*Primary Examiner*—Hung V. Ngo
(74) *Attorney, Agent, or Firm*—Stout, Uxa, Buyan & Mullins, LLP

(57) ABSTRACT

A stacking structure is described that permits stacking of electrical components with no requirement for an ancillary stacking framework. Electrical components are fabricated with inner and outer lead portions that provide connection to a substrate and to other electrical components in a stack.

21 Claims, 12 Drawing Sheets

METHOD AND APPARATUS FOR STACKING ELECTRICAL COMPONENTS USING OUTER LEAD PORTIONS AND EXPOSED INNER LEAD PORTIONS TO PROVIDE INTERCONNECTION

BACKGROUND OF THE INVENTION

1. Field of the Invention

The present invention relates generally to electrical component fabrication methods and, more particularly, to fabrication of thin packages containing a multiplicity of electrical components.

2. Description of Related Art

Personal devices that require a large number of electronic components to be provided in a small volume are rapidly proliferating. A pocket-sized personal music player that includes a hard disk is only one example of such a device. Today's personal electronic devices require that more and more functionality must be provided in a relatively small space. Traditionally, multi-chip electronic devices were fabricated by placing chips on a two-dimensional substrate such as a printed circuit board (PCB). As circuit density increased, methods were devised for stacking multiple chips, thereby trading a scarce resource of substrate area for space in a third dimension. Several prior- art structures for stacking multiple chips have been devised, but none has proven to be wholly satisfactory. The need to stack components typically requires fabricating a superstructure that supports the stacked components. This superstructure adds to the volume and weight, and therefore to the cost, of the component stack, thereby offsetting an advantage that may be gained by stacking. Some stacking structures make efficient use of space, but tend to be complicated and expensive to fabricate. Less complicated and expensive stacking structures may either fail to make efficient use of space and/or present problems in disposing of the heat generated by chips in a stack A need thus exists in the prior art for a stacking structure that is efficient in its use of space while being easy to fabricate. A further need exists for a structure that is capable of efficiently dissipating heat generated by stacked electronic components.

SUMMARY OF THE INVENTION

The present invention addresses these needs by providing a scalable structure for stacking electrical components using substantially identical parts. The stacking structure is fabricated into the parts, themselves, and no special stacking superstructure is needed. The invention described herein discloses a stacking structure for at least a first and a second electrical component wherein the first and second electrical components each include inner and outer leads. The second electrical component is capable of being stacked on the first electrical component. According to a representative embodiment, a connection between the first electrical component and the second electrical component is provided by contact between the inner leads of the first electrical component and the inner leads of the second electrical component. Moreover, the connection between the first electrical component and the second electrical component can be provided by contact between the outer leads of the first electrical component and the outer leads of the second electrical component.

A method of stacking at least a first electrical component and a second electrical component also is disclosed. According to one implementation of the method, first and second electrical components are fabricated, each electrical component having inner and outer leads. The second electrical component is stacked on the first electrical component by placing the inner leads of the first electrical component in contact with the inner leads of the second electrical component. According to another implementation of the method, the second electrical component is stacked on the first electrical component by placing the outer leads of the first electrical component in contact with the outer leads of the second electrical component.

While the apparatus and method has or will be described for the sake of grammatical fluidity with functional explanations, it is to be expressly understood that the claims, unless expressly formulated under 35 U.S.C. 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. 112 are to be accorded full statutory equivalents under 35 U.S.C. 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims that follow.

DETAILED DESCRIPTION OF THE PRESENTLY PREFERRED EMBODIMENTS

Figure 1A:
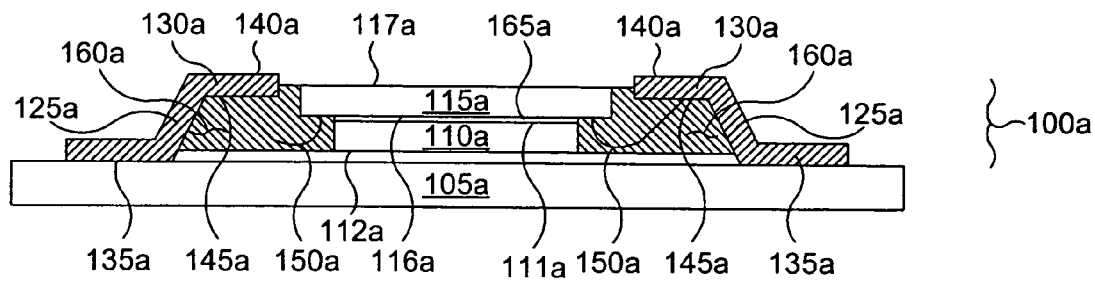
FIGS. 1A–1E are cross-sectional diagrams that illustrate embodiments of an electrical component stacking structure according to the present invention.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of stacking structures. The present invention may be practiced in conjunction with various integrated circuit fabrication techniques that are conventionally used in the art, and only so much of the commonly practiced process steps are included herein as are necessary to provide an understanding of the present invention.

Referring more particularly to the drawings, FIGS. 1A–1E are cross-sectional diagrams that illustrate embodiments of an electrical component stacking structure according to the present invention. The construction of the first electrical component 100a in FIG. 1A will be described in detail. Because the elements of electrical components illustrated in FIGS. 1B–1E correspond closely to the elements described in FIG. 1A, the descriptions of the elements in FIGS. 1B–1E will be abbreviated.

FIG. 1A is a cross-sectional diagram illustrating an embodiment of a first electrical component 100a mounted on a substrate 105a according to the present invention. In a typical implementation, the substrate 105a may be a printed circuit board (PCB). First electrical component 100a comprises a leadframe (not shown) having a plurality of leads 125a that include inner lead portions 130a and outer lead portions 135a. The inner lead portions 130a have wire-connecting surfaces 145a and wire non-connecting surfaces or mounting surfaces 140a. The illustrated embodiment further comprises a chip paddle 110a and a chip 115a, the chip 115a having an active surface 116a and an opposing non-active surface 117a. The chip paddle 110a may have an adhering surface 111a and an opposing non-adhering surface 112a. The leads 125a may be formed as part of the leadframe. A representative embodiment of the chip paddle 110a comprises at least one tie bar 113a (FIG. 5) that extends outwardly past an edge of the active surface 116a of the chip 115a.

Figure 5:
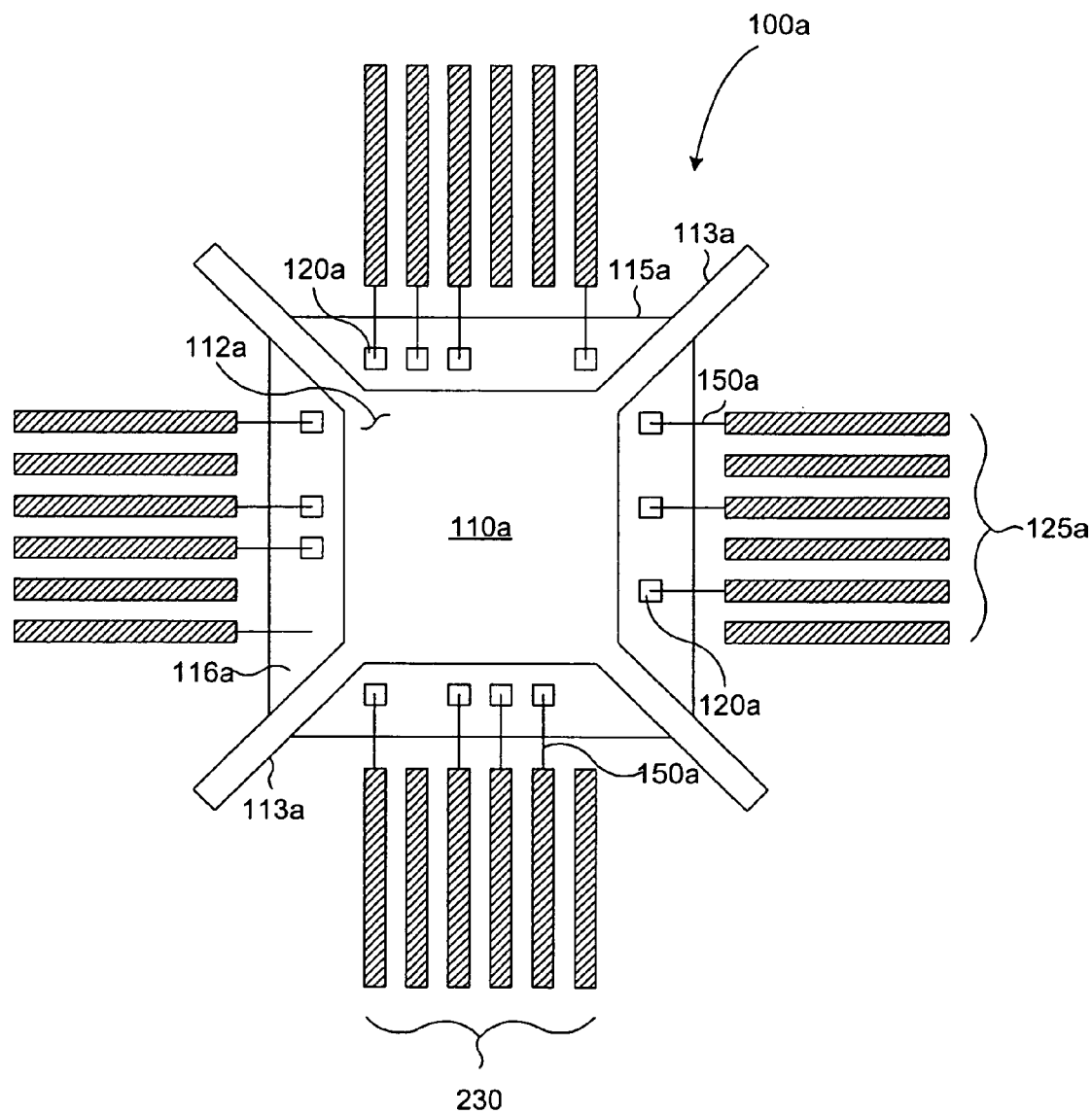
FIG. 5 is a plan view from below an embodiment of a stacking structure of the type illustrated in FIG. 1A.

The active surface 116a comprises a central area and a peripheral area having a plurality of bonding pads 120a (FIG. 5). The adhering surface 111a of the chip paddle 110a may be secured to the active surface 116a of the chip 115a by a non-conductive adhesive 165a, which may be either a solid or a liquid. The adhering surface 111a of the chip paddle 110a generally is secured to the active surface 116a of the chip 115a in a manner that avoids contact with the bonding pads. First electrical component 100a further comprises a plurality of wires 150a that connect bonding pads 120a (FIG. 5) on the active surface 116a to wire-connecting surfaces 145a of the inner lead portions 130a.

Molding resin 160a encapsulates the active surface 116a of the chip 115a, the bonding pads, the adhering surface 111a of the chip paddle 110a, the wire-connecting surfaces 145a of the inner portions 130a of leads 125a, and the wires 150a in the illustrated embodiment. The encapsulation leaves the non-active surface 117a of the chip 115a, the non-adhering surface 112a of the chip paddle 110a, and the mounting surfaces 140a of the inner lead portions 130a exposed. Exposing these elements of first electrical component 100a may enhance the dispersion of thermal energy produced in chip 115a. The outer lead portions 135a provide mechanical and electrical contact between first electrical component 100a and the substrate 105a in a typical embodiment.

A plan view from below an embodiment of a stacking structure of the type illustrated in FIG. 1A, comprising first electrical component 100a, is illustrated in FIG. 5. The substrate 105a and the molding resin 160a are not shown in this view in order that details of the chip paddle 110a may be made visible. The non-adhering surface 112a of the chip paddle 110a and four tie bars 113a as well as a plurality of bonding pads 120a disposed on the active surface 116a of the chip 115a are illustrated in this view. The adhesive surface 111a (FIG. 1A) of the chip paddle 110a is secured to the active surface 116a of the chip 115a in a manner such that the chip paddle 110a and the tie bars 113a do not interfere with the bonding pads 120a. Some leads of the plurality of leads 125a may be connected to bonding pads 120a by wires 150a.

Figure 1B:
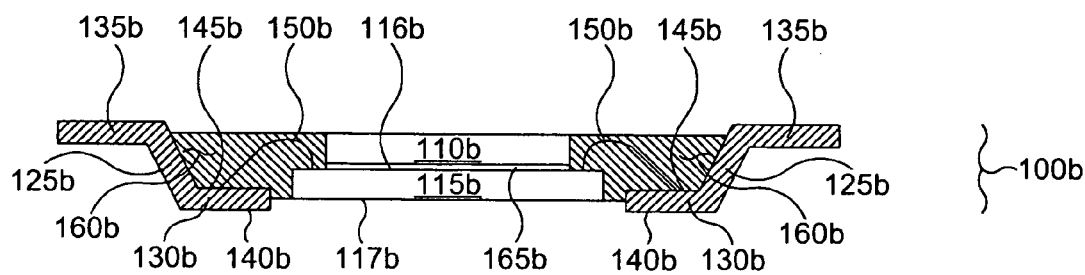

FIG. 1B is a cross-sectional diagram that illustrates a second electrical component 100b formed according to the present invention. Second electrical component 100b is substantially identical in construction to first electrical component 100a (FIG. 1A). However, the orientation of second electrical component 100b is inverted relative to the orientation of first electrical component 100a as illustrated in FIG. 1A. Elements of the second electrical component 100b correspond to like elements of the first electrical component 100a illustrated in FIG. 1A. For example, chip paddle 110b corresponds to chip paddle 110a in FIG. 1A, chip 115b corresponds to chip 115a in FIG. 1A and so on. In particular, inner lead portions 130b correspond to inner lead portions 130a (FIG. 1A), and outer lead portions 135b correspond to outer lead portions 135a (FIG. 1A).

Figure 1C:
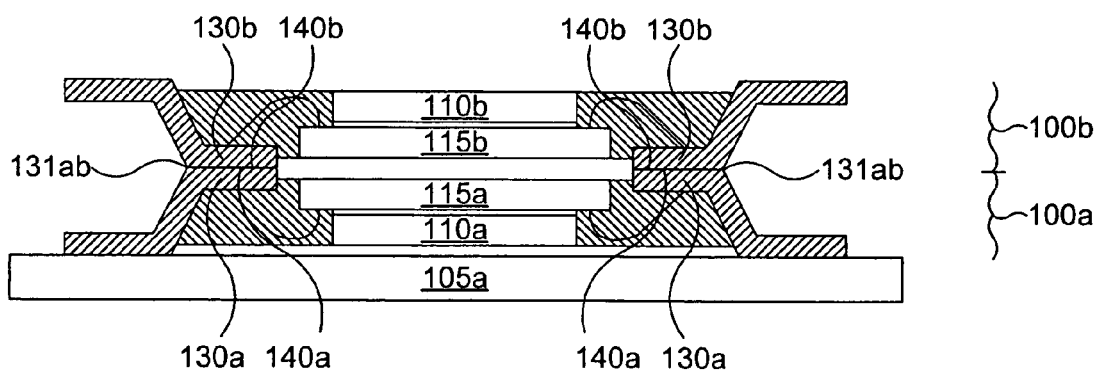

FIG. 1C is a cross-sectional diagram that depicts the second electrical component 100b (FIG. 1B) stacked on the first electrical component 100a (FIG. 1A) according to the present invention. First electrical component 100a and second electrical component 100b are connected by electrical connections 131ab. Electrical connections 131ab are provided by placing the mounting surfaces 140a of inner lead portions 130a of first electrical component 100a in contact with the mounting surfaces 140b of inner lead portions 130b of second electrical component 100b. The basic structure of first and second electrical components 100a and 100b enables the stacking. No additional framework or connections are required to make the stacking possible.

Figure 1D:
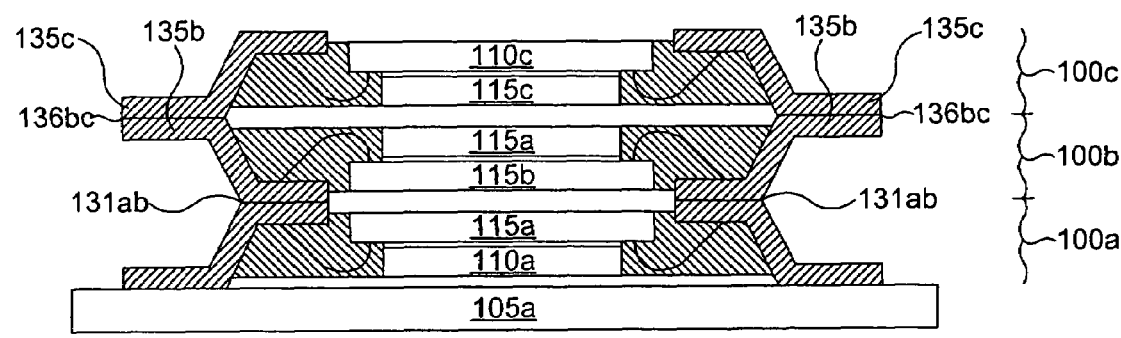

FIG. 1D is a cross-sectional diagram showing an embodiment of a stack of three electrical components according to the present invention. The illustrated three-component stack comprises a third electrical component 100c having construction substantially identical to that of first and second electrical components 100a (FIG. 1A) and 100b (FIG. 1B). Electrical connections 136bc between the second electrical component 100b and the third electrical component 100c are provided in this instance by the outer lead portions 135b and 135c. Again, the basic structure of the electrical components enables the stacking, and no additional framework or connections are required.

Figure 1E:
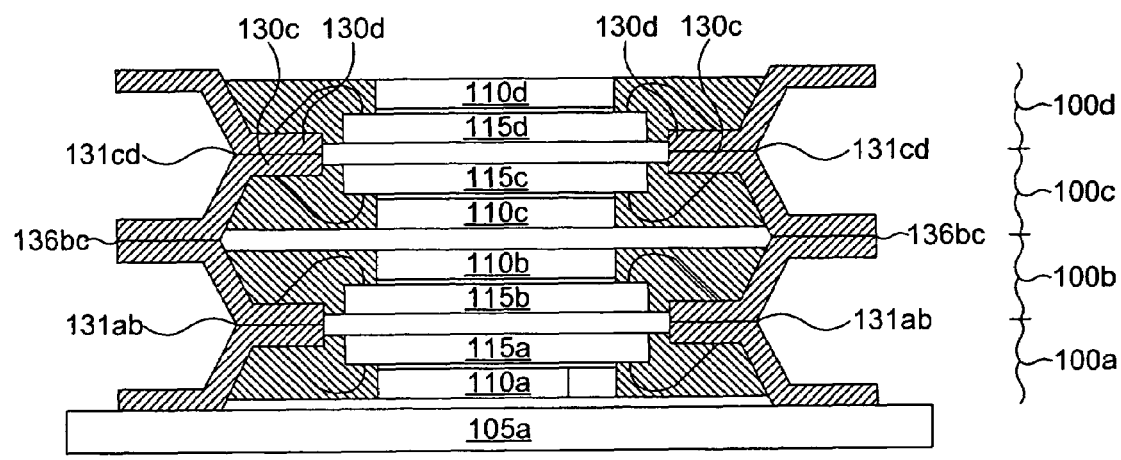

FIG. 1E is a cross-sectional diagram that illustrates a way of adding a fourth electrical component 100d to the stack illustrated in FIG. 1D. The four-component stack comprises a fourth electrical component 100d constructed to be substantially similar to first electrical component 100a (FIG. 1A). Electrical connections 131cd between the third electrical component 100c and the fourth electrical component 100d are provided by the mounting surfaces of inner lead portions 130c and 130d. It should be clear from the examples illustrated in FIGS. 1C–1E that electrical components of the form of first electrical component 100a (FIG. 1A) can be stacked indefinitely.

Figure 2A:
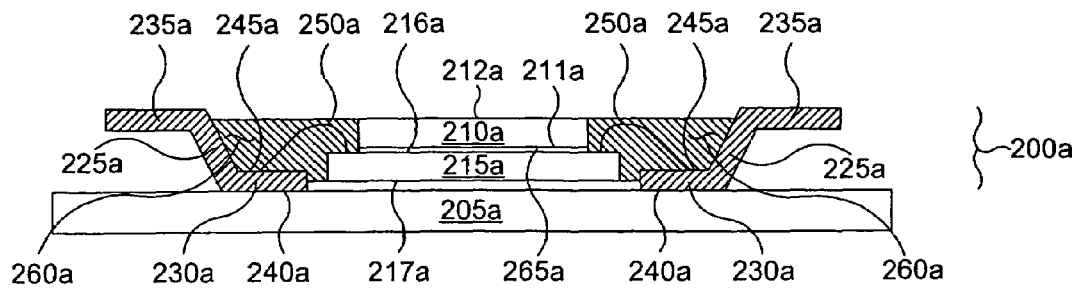
FIGS. 2A–2E are cross-sectional diagrams that illustrate a modified implementation of a stacking structure constructed according to the present invention.

FIGS. 2A–2E are cross-sectional diagrams that illustrate a modified implementation of a stacking structure constructed according to the present invention. FIG. 2A is a cross-sectional diagram describing an embodiment of a first electrical component 200a mounted on a substrate 205a that may be a PCB. Generally, first electrical component 200a has a form similar to first electrical component 100a (FIG. 1A), but inverted. Contact with the substrate 205a is provided by inner lead portions 230a, rather than outer lead portions 235a as is now more particularly described. First electrical component 200a comprises a plurality of leads 225a that include inner lead portions 230a and outer lead portions 235a. The inner lead portions 230a have wire-connecting surfaces 245a and mounting surfaces 240a. The leads 225a are formed as part of a leadframe (not shown) that also comprises a chip paddle 210a having an adhering surface 211a and a non-adhering surface 212a. The chip paddle 210a may comprise at least one tie bar similar to the tie bars 113a illustrated in FIG. 5. The embodiment illustrated in FIG. 2A further comprises a chip 215a having an active surface 216a and an opposing non-active surface 217a. One form of tie bar extends at least outwardly past an edge of the active surface 216a of the chip 215a. A plurality of bonding pads (not shown) may be disposed on the active surface 216a. The adhering surface 211a of the chip paddle 210a is attached to the active surface 216a of the chip 215a in a manner that does not interfere with the bonding pads. A non-conductive adhesive 265a may provide the attachment between the adhering surface 211a of the chip paddle 210a and the active surface 216a of the chip 215a. A plurality of wires 250a connects the plurality of bonding pads to wire-connecting surfaces 245a.

Parts of the leadframe, including the adhering surface 211a of the chip paddle 210a, the bonding pads, the wire-connecting surfaces 245a of leads 225a, and the active surface 216a of the chip 215a are encapsulated in molding resin 260a. The encapsulation leaves the non-active surface 217a of the chip 215a, the outer lead portions 235a, and the mounting surfaces 240a of the inner lead portions 230a exposed. Again, the illustrated embodiment differs from the embodiment illustrated in FIG. 1A in that mechanical and electrical contact between first electrical component 200a and the substrate 205a is provided by the mounting surfaces 240a of the inner lead portions 230a rather than by the outer lead portions 235a.

Figure 2B:
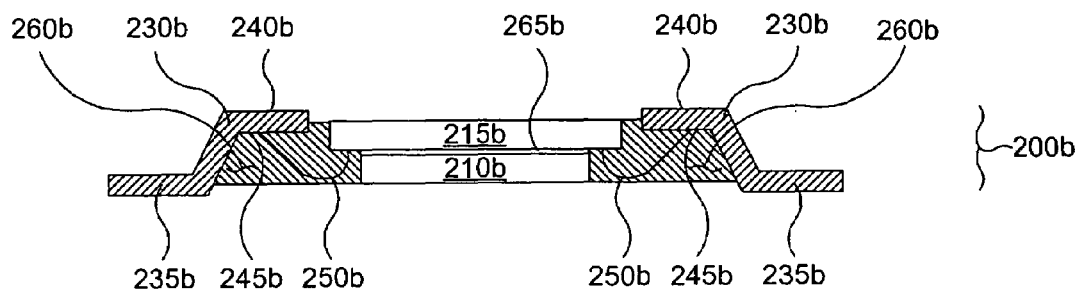

FIG. 2B is a cross-sectional diagram that depicts a second electrical component 200b fabricated according to the present invention. Following the exposition for FIG. 1B, elements of the second electrical component 200b correspond to similar elements of first electrical component 200a (FIG. 2A). For example, inner lead portions 230b correspond to inner lead portions 230a (FIG. 2A). The similarity between second electrical component 200b and first electrical component 200a (FIG. 2A) ends to the extent that, for example, second electrical component 200b is inverted relative to first electrical component 200a (FIG. 2A).

Figure 2C:
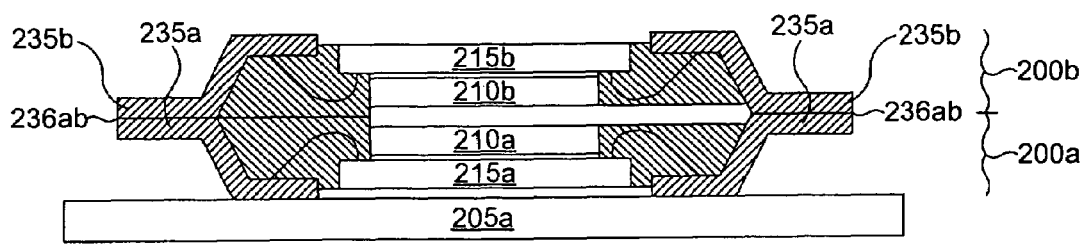

FIG. 2C is a cross-sectional diagram illustrating how second electrical component 200b (FIG. 2B) can be stacked on first electrical component 200a (FIG. 2A). Outer lead portions 235a and 235b provide electrical connections 236ab between the first electrical component 200a and the second electrical component 200b.

Figure 2D:
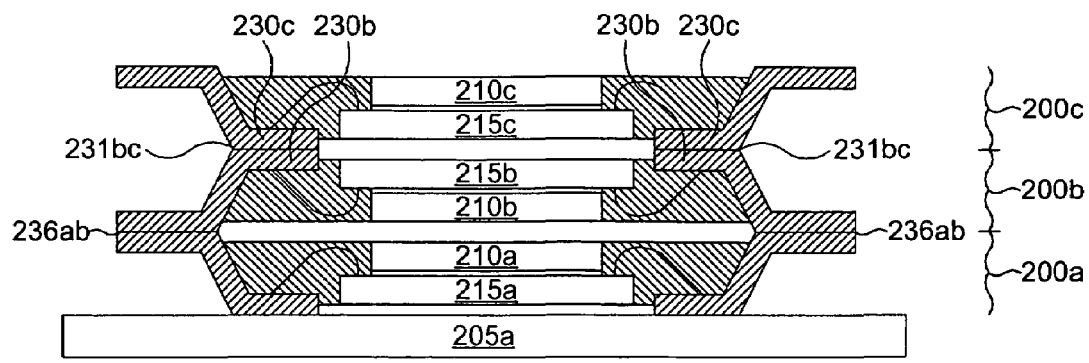

FIG. 2D is a cross-sectional diagram that presents an embodiment of a stack of three electrical components according to the present invention. A third electrical component 200c formed in a manner similar to first electrical component 200a (FIG. 2A) stacks onto second electrical component 200b. Electrical connections 231bc are provided by the mounting surfaces of the inner lead portions 230b and 230c.

Figure 2E:
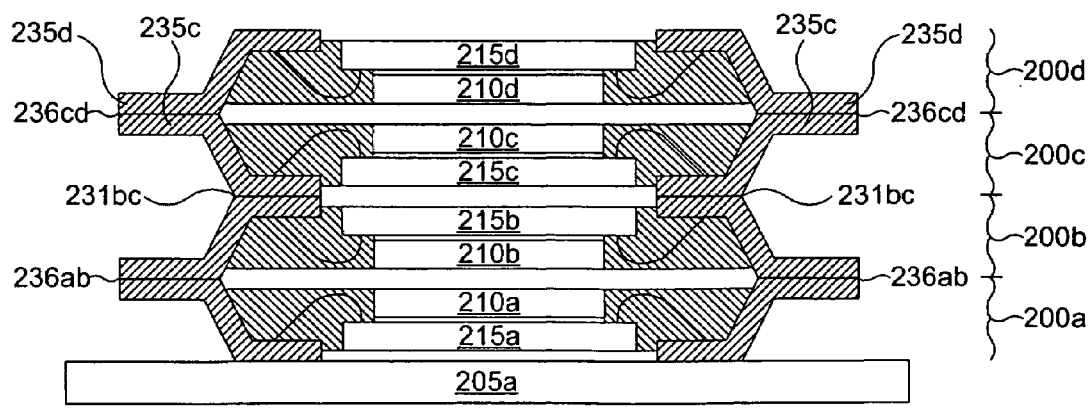

FIG. 2E is a cross-sectional diagram illustrating a method of stacking a fourth electrical component 200d on the stack described in FIG. 2D. The fourth electrical component 200d is formed in a manner similar to the second electrical component 200b (FIG. 2B). Electrical connections 236cd between the third electrical component 200c and the fourth electrical component 200d are provided by outer lead portions 235c and 235d.

FIGS. 3A–3E are cross-sectional diagrams illustrating alternative embodiments of electrical component stacking structures that employ the method of the present invention. These figures demonstrate that the invention can comprise electrical components having more than one chip. For example, the cases illustrated in FIGS. 3A–3E employ electrical components comprising two chips.

Figure 3A:
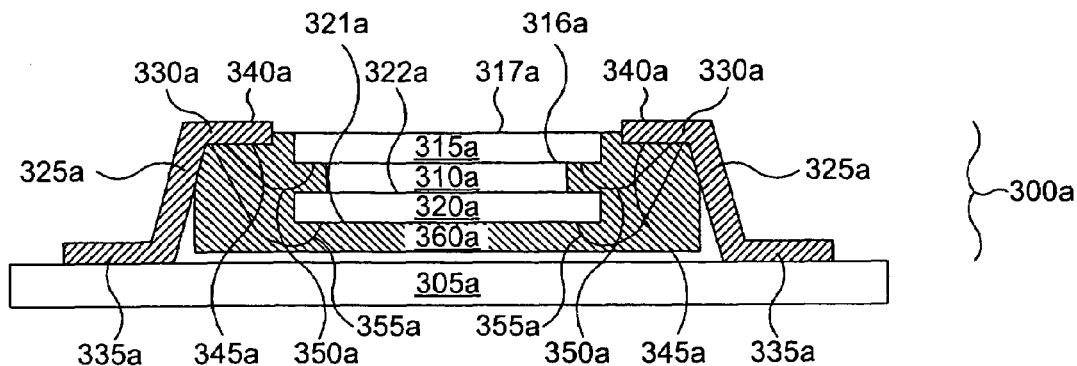
FIGS. 3A–3E are cross-sectional diagrams that illustrate alternative embodiments of electrical component stacking structures that employ the method of the present invention.

FIG. 3A is a cross-sectional view of an embodiment of an electrical component 300a that comprises first and second chips 315a and 320a. First chip 315a has a first active surface 316a and an opposing first non-active surface 317a. The first active surface 316a normally comprises a first central area and a peripheral area having a plurality of bonding pads (not shown). A chip paddle 310a having a first adhering surface and an opposing second adhering surface (neither adhering surface is designated in FIG. 3A) is secured to the first active surface 316a of the first chip 315a. The first adhering surface of the chip paddle 310a may be secured to the central area of the first active surface 316a in a manner that does not interfere with the first plurality of bonding pads.

Second chip 320a has a second active surface 321a that may comprise a second plurality of bonding pads (not shown) and an opposing second non-active surface 322a. The second non-active surface 322a is secured to the second adhering surface of the chip paddle 310a. The electrical component 300a further comprises leads 325a that may be formed as part of a leadframe that also comprises the chip paddle 310a. The leads 325a in the illustrated embodiment comprise inner lead portions 330a and outer lead portions 335a. The inner lead portions 330a have wire-connecting surfaces 345a and mounting surfaces 340a. The electrical component 300a also comprises first and second pluralities of wires 350a and 355a. The first plurality of wires 350a connects the first plurality of bonding pads to certain ones of wire-connecting surfaces 345a. Likewise, the second plurality of wires 355a connects the second plurality of bonding pads to other ones of wire-connecting surfaces 345a.

The active surface 316a of first chip 315a, the second chip 320a, the chip paddle 310a, and first and second pluralities of wires 350a and 355a may be encapsulated in molding resin 360a, with the non-active surface 317a of the first chip 315a exposed. The outer lead portions 335a and the mounting surfaces 340a of the inner lead portions 330a also may be exposed, not being encapsulated in molding resin 360a. Exposing these elements of electrical component 300a may provide additional thermal dispersion when compared to the prior art. The electrical component 300a is mounted on a substrate 305a with electrical contact provided between the substrate 305a and the electrical component 300a by the outer lead portions 335a.

Figure 3B:
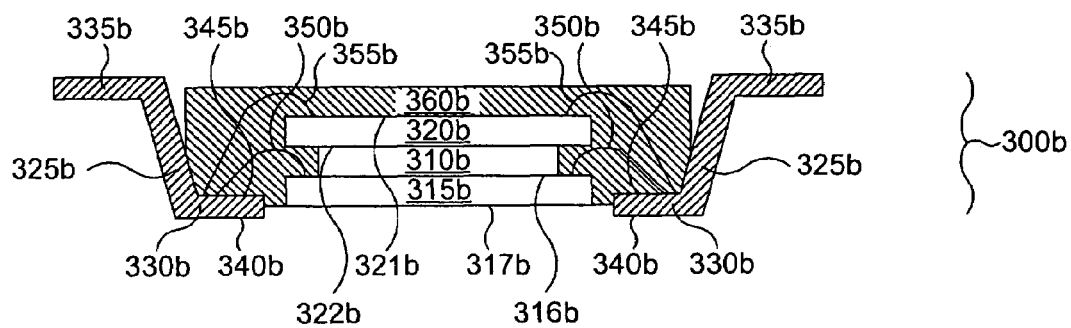

FIG. 3B is a cross-sectional diagram depicting another electrical component 300b constructed according to the present invention. Electrical component 300b is similar to electrical component 300a (FIG. 3A) wherein elements of electrical component 300b correspond to like elements of electrical component 300a, except that electrical component 300b is illustrated in an inverted position relative to the position of electrical component 300a (FIG. 3A).

Figure 3C:
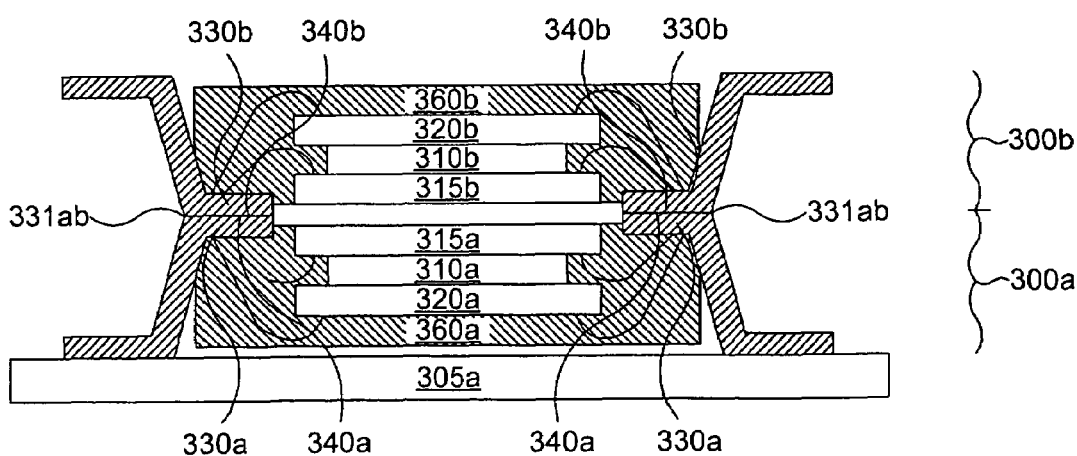

FIG. 3C is a cross-sectional diagram that illustrates how electrical component 300b (FIG. 3B) may be stacked on electrical component 300a (FIG. 3A) according to the present invention. The mounting surfaces 340a (FIG. 3A) and 340b (FIG. 3B) of inner lead portions 330a and 330b provide electrical connections 331ab between electrical component 300a and electrical component 300b. As already described, the basic structure of the electrical components 300a and 300b facilitates the stacking.

Figure 3D:
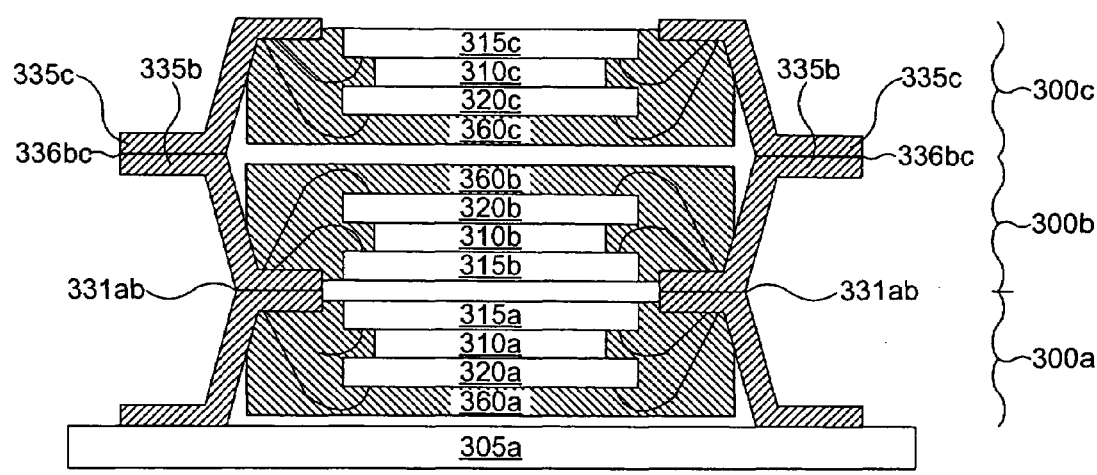

FIG. 3D is a cross-sectional diagram illustrating an embodiment of three electrical components 300a, 300b, and 300c stacked together according to the present invention. The construction in FIG. 3D comprises a stack of the type illustrated in FIG. 3C with a third electrical component 300c stacked thereon. Electrical component 300c is similar in mechanical respects to electrical component 300a (FIG. 3A). Electrical connection 336bc between electrical component 300b and electrical component 300c is provided by outer lead portions 335b and 335c.

Figure 3E:
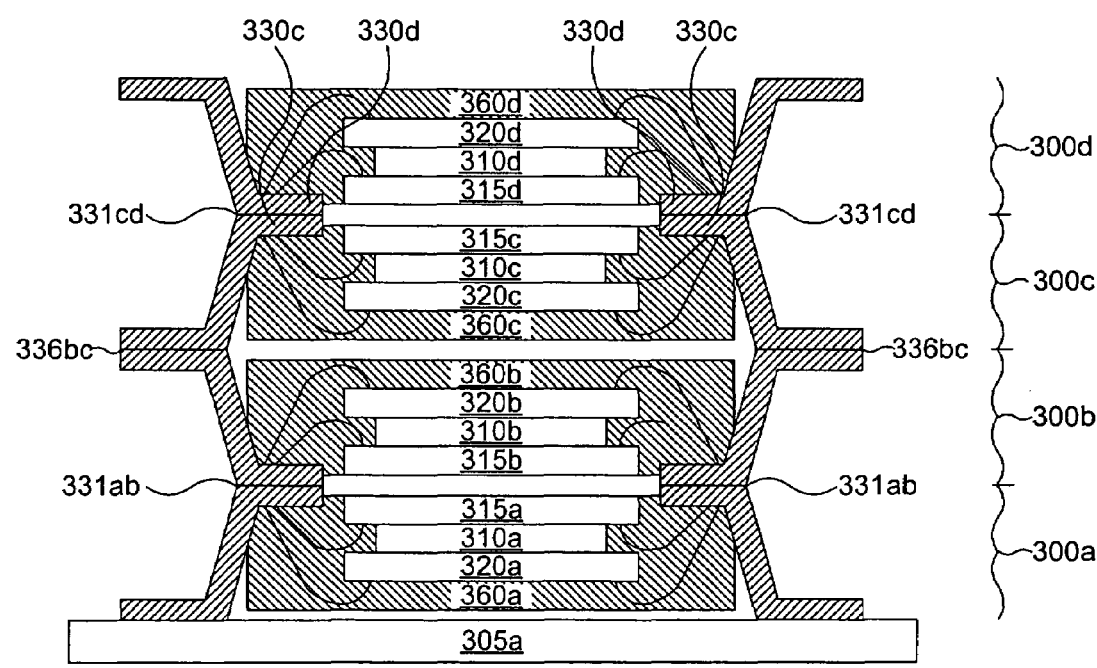
Figure 4A:
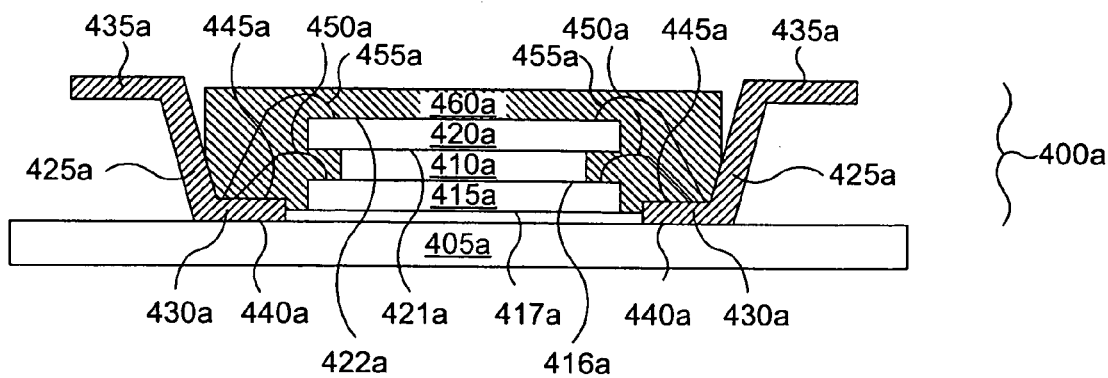
FIGS. 4A–4E are cross-sectional diagrams that illustrate other alternative embodiment of stacking structures according to the present invention.
Figure 4B:
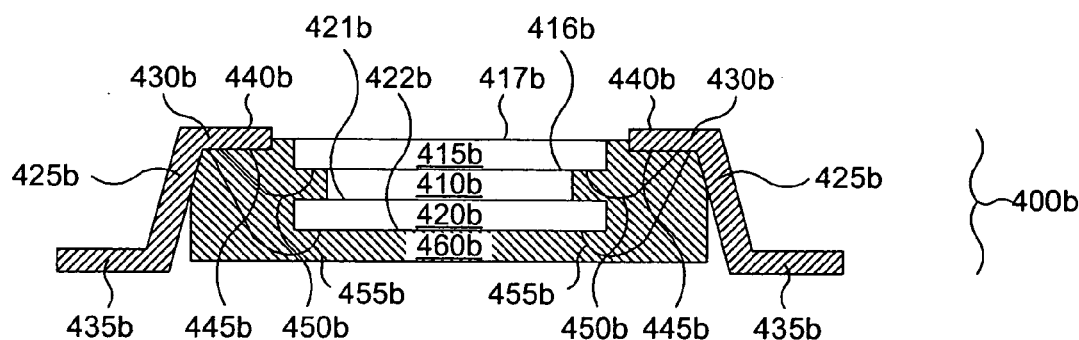
Figure 4C:
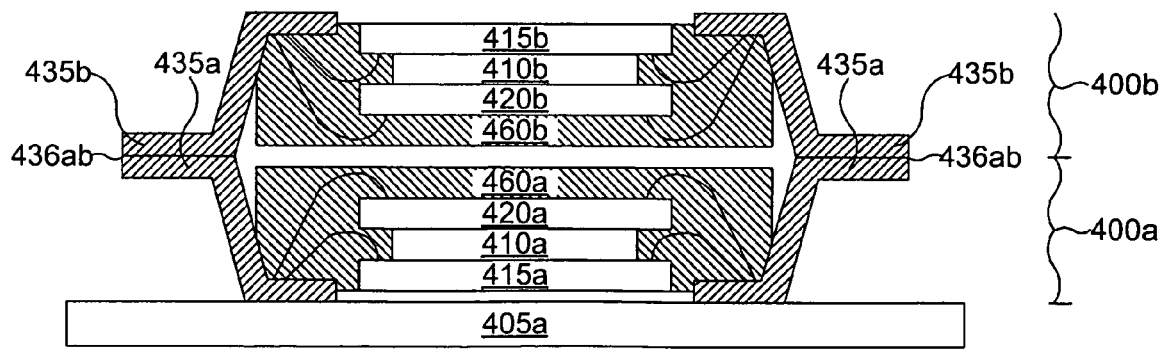
Figure 4D:
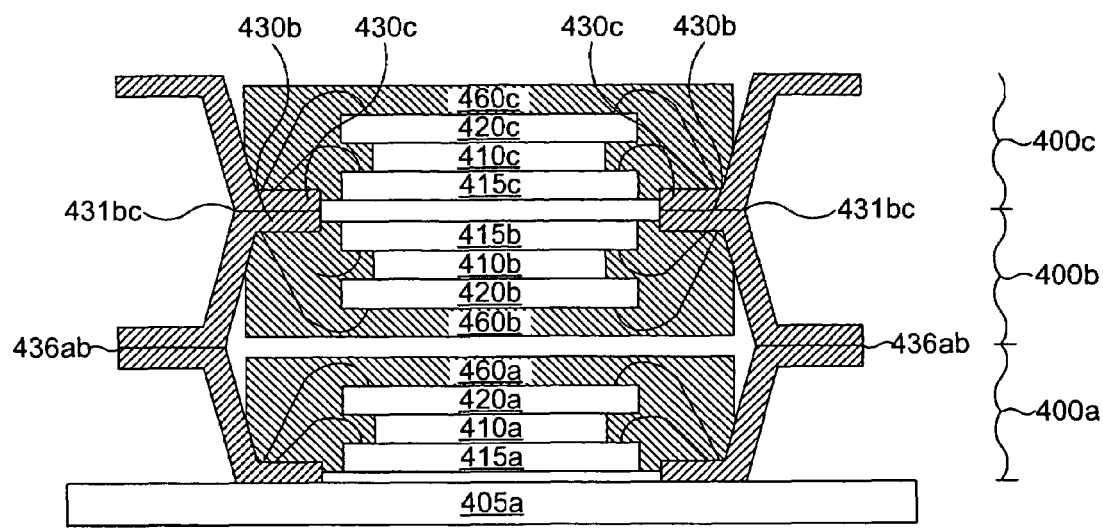
Figure 4E:
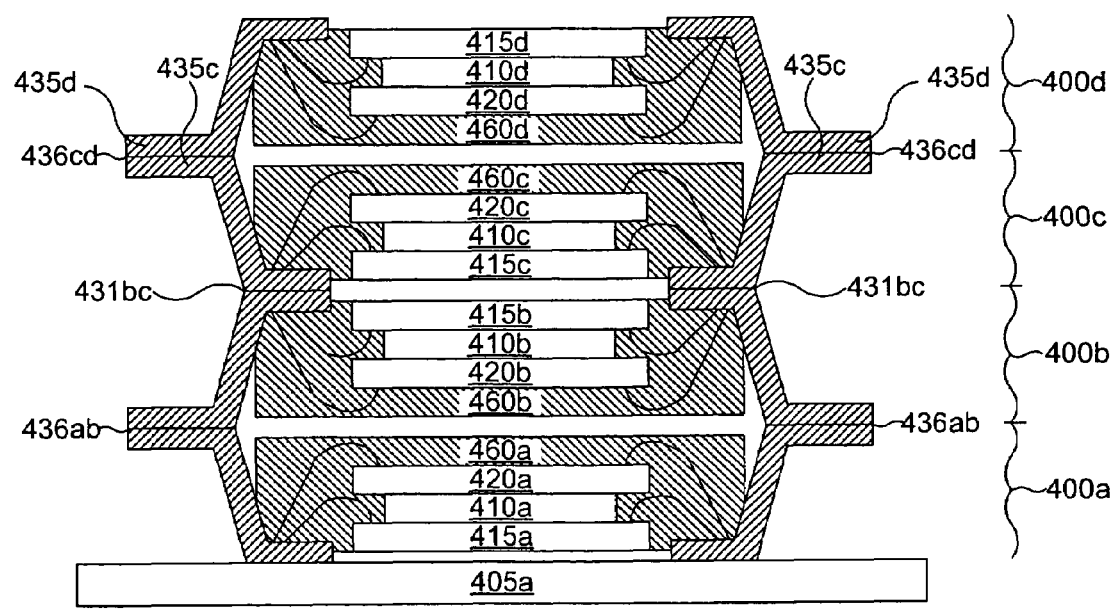

FIG. 3E is a cross-sectional diagram that shows how the process can be continued with electrical component 300d added to the stack illustrated in FIG. 3D. As before, electrical component 300d is substantially similar to the other electrical components 300a, 300b, and 300c. Electrical component 300d connects electrically to electrical component 300c with connection 331cd using the mounting surfaces of inner lead portions 330c and 330d.

FIGS. 4A–4E are cross-sectional diagrams that illustrate other alternative embodiments of a stacking structure according to the present invention. FIGS. 4A–4E are similar in all essential respects to FIGS. 3A–3E. Reference designators of the form 4xxx and 4xxxx in FIGS. 4A–4E correspond to similar reference designators of the form 3xxx and 3xxxx in FIGS. 3A–3E. Electrical components illustrated in FIGS. 4A–4E are inverted relative to their counterparts in FIGS. 3A–3E. A review and comparison of FIGS. 1A–1E, 2A–2E, and 3A–3E will elucidate to one skilled in the art the method of stacking the electrical components shown in FIGS. 4A–4E.

Figure 6A:
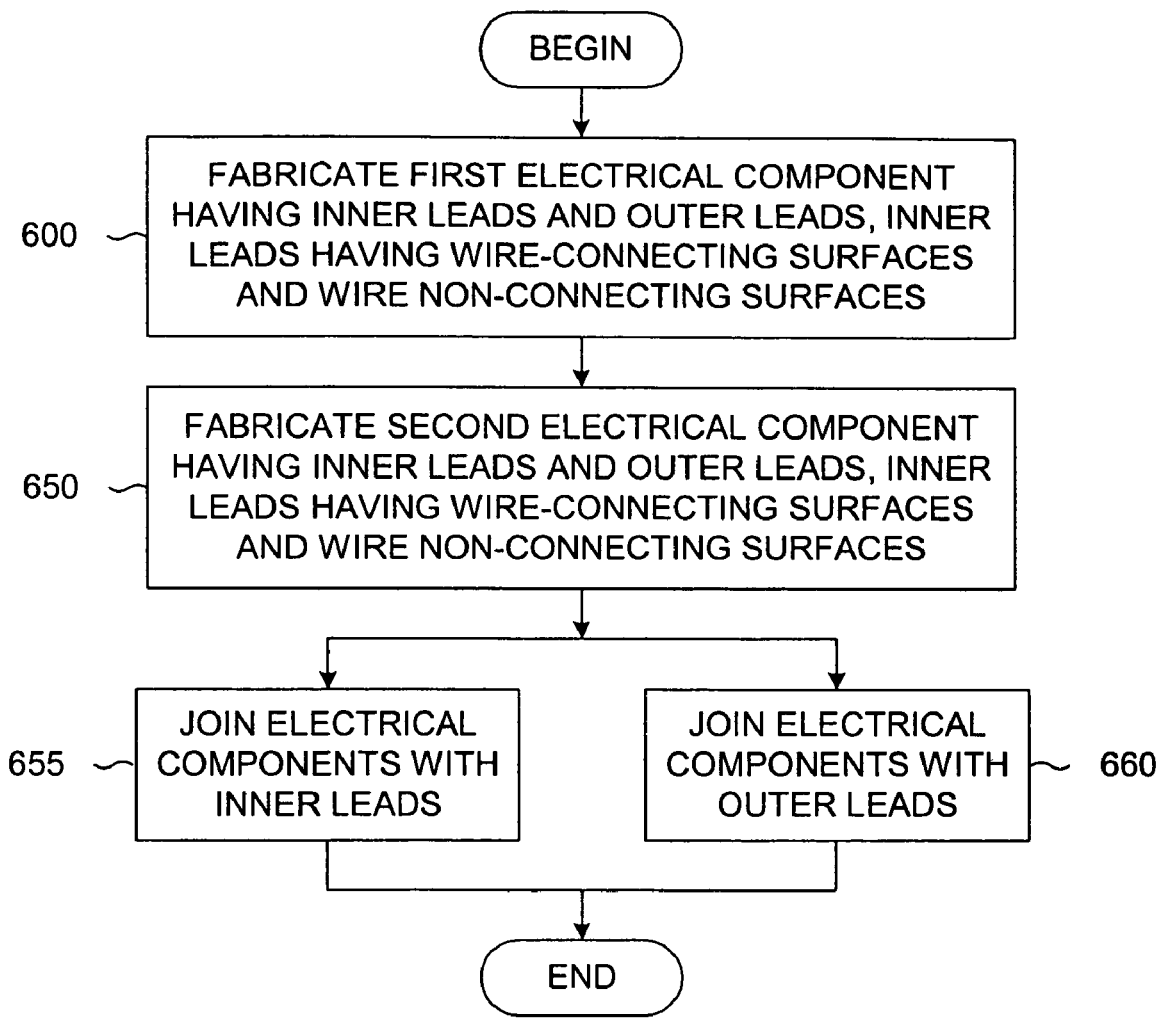
FIGS. 6A–6C are flow diagrams that describe a method of stacking electrical components according to the present invention.
Figure 6B:
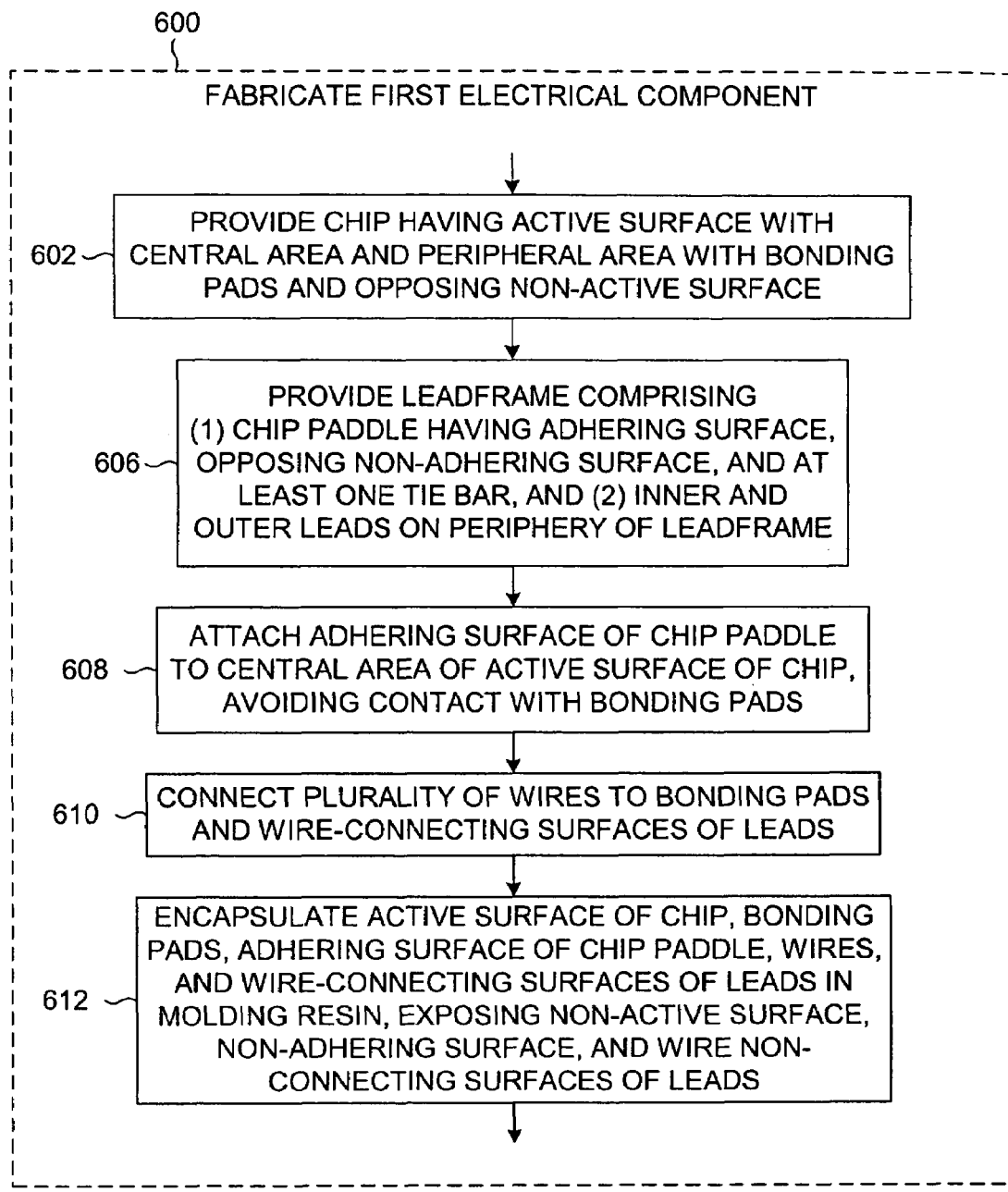
Figure 6C:
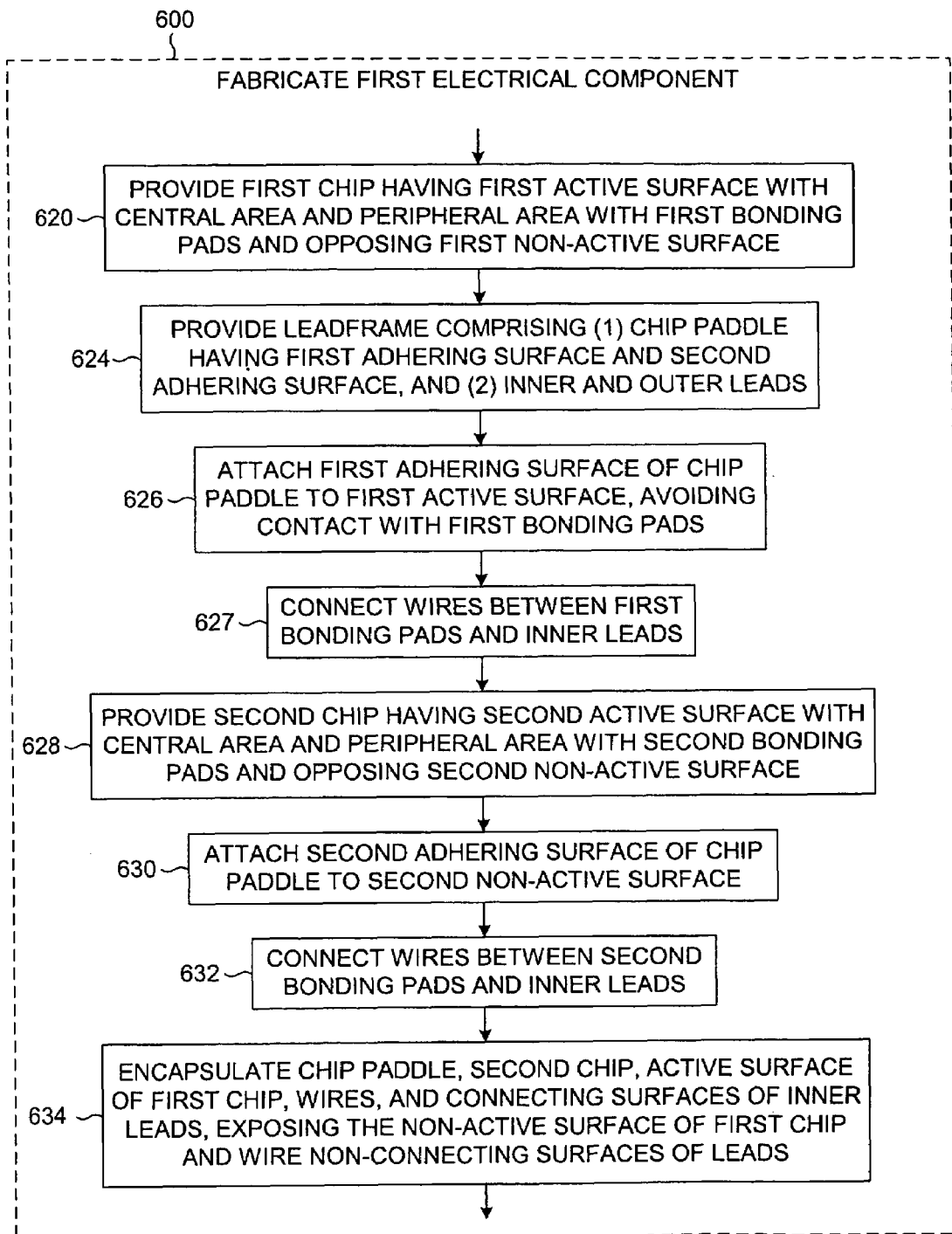

FIGS. 6A–6C are flow diagrams that describe a method of stacking electrical components according to the present invention. The flow diagram of FIG. 6A describes a high-level implementation of the method. With reference, for example, to FIG. 1A, the method calls for fabricating a first electrical component 100a at step 600, the first electrical component having inner lead portions 130a and outer lead portions 135a. The inner lead portions 130a have wire-connecting surfaces 145a and mounting surfaces 140a. In typical embodiments, the first electrical component 100a is mounted on a substrate 105a. A second electrical component, substantially identical to the first electrical component, is fabricated at step 650. An example of such a second electrical component is illustrated in FIG. 1B. With reference to FIG. 1C, a second electrical component 100b may be stacked on and connected to a first electrical component 100a at step 655. The stacking can result from joining mounting surfaces 140b of inner lead portions 130b of the second electrical component 100b to mounting surfaces 140a of inner lead portions 130a of the first electrical component 100a. Alternatively, with reference to FIG. 2C, the stacking can result at step 660 from joining outer lead portions 235b of a second electrical component 200b with outer lead portions 235a of a first electrical component 200a.

The flow diagram of FIG. 6B illustrates an implementation of fabricating a first electrical component recited at step 600. Referring to FIG. 1A, a chip 115a is provided at step 602, the chip having an active surface 116a and an opposing non-active surface 117a. The active surface 116a of the chip 115a normally comprises a plurality of bonding pads. A leadframe is provided at step 606, the leadframe comprising a chip paddle 110a having an adhering surface 111a and an opposing non-adhering surface 112a. The chip paddle 110a further may include at least one tie bar 113a (FIG. 5). Leads 125a having inner lead portions 130a and outer lead portions 135a are disposed on a periphery of the leadframe. The adhering surface 111a of the chip paddle 110a is attached to the active surface 116a of chip 115a at step 608. A plurality of wires 150a is provided at step 610, the plurality of wires 150a being connected to couple the plurality of bonding pads to wire-connecting surfaces 145a of the inner lead portions 130a. The active surface 116a of chip 115a, the bonding pads, the adhering surface 111a of chip paddle 110a, the plurality of wires 150a, and the wire-connecting surfaces 145a of leads 125a are encapsulated in molding resin 160a at step 612. The encapsulation is carried out in a manner that leaves the non-active surface 117a of chip 115a, the non-adhering surface 112a of chip paddle 110a, and mounting surfaces 140a of the inner lead portions 130a exposed.

FIG. 6C is a flow diagram illustrating another implementation of fabricating a first electrical component as set forth in step 600. Referring to FIG. 3A, a first chip 315a is provided at step 620, the first chip 315a having a first active surface 316a and an opposing first non-active surface 317a. First chip 315a has a first plurality of bonding pads formed on the first active surface 316a. A leadframe is provided at step 624 that comprises a chip paddle 310a having a first adhering surface and an opposing second adhering surface. The leadframe has leads 325a comprising inner lead portions 330a and outer lead portions 335a disposed on a periphery of the leadframe. The first adhering surface of chip paddle 310a may be attached to the first active surface 316a of first chip 315a at step 626. The attachment is performed in a manner such that contact between the chip paddle 310a and the first bonding pads is avoided. A second chip 320a having a second active surface 321a and an opposing second non-active surface 322a is provided at step 628. The second adhering surface of the chip paddle 310a is attached to the second non-active surface 322a of second chip 320a at step 630. A first plurality of wires 350a is connected between the first plurality of bonding pads and certain ones of wire-connecting surfaces 345a of inner lead portions 330a at step 632. Also at step 632, a second plurality of wires 355a is connected between the second plurality of bonding pads and other ones of wire-connecting surfaces 345a of inner lead portions 330a. The chip paddle 310a, second chip 320a, the first active surface 316a of first chip 315a, the pluralities of wires 350a and 355a, and the wire-connecting surfaces 345a of inner lead portions 330a are encapsulated in molding resin at step 634. The encapsulating is performed in a manner that exposes the first non-active surface 316a of first chip 315a and mounting surfaces 340a of leads 325a.

The stacking structures described in the foregoing can reduce stacking thickness thereby permitting a relatively larger number of electrical components to be stacked in a limited space. Stacking more electrical components can provide more electronic functionality in a given volume than previously was possible. For example, memory density can be significantly improved by employing the present invention in memory designs. The stacking methods disclosed herein are compatible with commonly-used industry assembly processes and with surface mount technology (SMT) processes. These methods further enhance the efficiency of thermal dispersion in integrated circuit packages as described herein.

According to prior art methods, chips intended for use in a multi-chip stack would typically undergo full functional testing at the wafer level before assembly, in order to prevent a single failing chip from causing failure of the whole assembly. In contrast, components assembled according to the present invention may be tested after each subassembly (see for example FIGS. 1A, 1B, 2A, and 2B) is completed, thereby removing the necessity of knowing that a die is good before assembly of a stacked structure begins.

In view of the foregoing, it will be understood by those skilled in the art that the methods of the present invention can facilitate formation of stacked electrical components. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A stacking structure for electrical components, comprising:
   a first electrical component that includes first leads having first inner lead portions and first outer lead portions; and
   a second electrical component that includes second leads having second inner lead portions and second outer lead portions, the second electrical component being capable of being stacked on the first electrical component by placing the second inner lead portions in contact with the first inner lead portions, and also being capable of being stacked on the first electrical component by placing the second outer lead portions in contact with the first outer lead portions;
   wherein the first electrical component further comprises:
      a chip having an active surface and an opposing non-active surface, wherein the active surface comprises a central area and a peripheral area having a plurality of bonding pads;
      a lead frame comprising the first leads, a plurality of tie bars, and a chip paddle having an adhering surface and a opposing non-adhering surface, the adhering surface being connected with the central area, the tie bars being connected to the chip paddle and attached to the active surface of the chip in such a way as to avoid contact with the bonding pads, each of the first leads comprising a wire-connecting surface and a wire non-connecting surface;
      a plurality of wires electrically connecting bonding pads and wire-connecting surfaces of the first leads; and
      an encapsulation covering the active surface of the chip, the bonding pads, the adhering surface of the chip paddle, and the wire-connecting surfaces of the first leads and the wires, such that the opposing non-active surface of the chip, the opposing non-adhering surface of the chip paddle and the wire non-connecting surfaces of the first leads are exposed.

2. The stacking structure as set forth in claim 1, wherein the chip paddle is attached to the active surface by one of a solid and a liquid non-conductive adhesive.

3. The stacking structure as set forth in claim 1, wherein the second inner lead portions contact the first inner lead portions and the stacking structure further comprises a third electrical component including third leads laving third inner lead portions and third outer lead portions, the third outer lead portions contacting the second outer lead portions.

4. The stacking structure as set forth in claim 3, further comprising a fourth electrical component including fourth leads having fourth inner lead portions and fourth outer lead portions, the fourth inner lead portions contacting the third inner lead portions.

5. The stacking structure as set forth in claim 1, wherein the second outer lead portions contact the first outer lead portions and the stacking structure further comprises a third electrical component including third leads having third inner lead portions and third outer lead portions, the third inner lead portions contacting the second inner lead portions.

6. The stacking structure as set forth in claim 5, further comprising a fourth electrical component including fourth leads having fourth inner lead portions and fourth outer lead portions, the fourth outer lead portions contacting the third outer lead portions.

7. A stacking structure for electrical components, comprising:
   a first electrical component that includes first leads having first inner lead portions and first outer lead portions; and
   a second electrical component that includes second leads having second inner lead portions and second outer lead portions, the second electrical component being capable of being stacked on the first electrical component by placing the second inner lead portions in contact with the first inner lead portions, and also being capable of being stacked on the first electrical component by placing the second outer lead portions in contact with the first outer lead portions;
   wherein the first electrical component comprises (i) a first chip having an active surface and an opposing non-active surface, wherein the active surface comprises a central area and a peripheral area having a plurality of first bonding pads, and (ii) a lead frame comprising the first leads and a chip paddle having a first adhering surface and a second adhering surface, the first adhering surface being adhered to the active surface of the first chip in such a way as to avoid contact with the first bonding pads, and each of the first leads comprising a wire connecting surface and a wire non-connecting surface;
   wherein the second electrical component comprises a second chip having an active surface and an opposing non-active surface connecting with the second adhering surface of the chip paddle, wherein the active surface of the second chip comprises a central area and a peripheral area having a plurality of second bonding pads;

wherein the stacking structure further comprises a plurality of wires, parts of which electrically connect first bonding pads with first leads, and parts of which electrically connect second bonding pad with first leads; and wherein an encapsulation covers the chip paddle, the second chip, the wire connecting surfaces of the first leads, the active surface of the first chip and the wires, with the non-active surface of the first chip and the wire non-connecting surfaces of the first leads exposed beyond the encapsulation.

8. The stacking structure as set forth in claim 7, wherein the first adhering surface of chip paddle is attached to the first active surface by one of a solid and a liquid non-conductive adhesive.

9. The stacking structure as set forth in claim 7, wherein the second adhering surface of the chip paddle is attached to the second non-active surface by one of a solid and a liquid adhesive.

10. A method of stacking at least a first electrical component and a second electrical component, comprising:
   providing a first electrical component including first leads having first inner lead portions and first outer lead portions;
   providing second electrical component including second leads having second inner lead portions and second outer lead portions;
   stacking the second electrical component on the first electrical component by one of placing the second inner lead portions in contact with the first inner lead portions and placing the second outer lead portions in contact with the first outer lead portions;
   wherein the providing of the first electrical component comprises:
      providing a chip having an active surface and an opposing non-active surface, the active surface having a central area and a peripheral area, the peripheral area having a plurality of bonding pads;
      fabricating a leadfrarne comprising a chip paddle having an adhering surface, a non-adhering surface, and at least one tie bar, the leadframe having the first leads disposed at a periphery thereof;
      securing the adhering surface of the chip paddle to the active surface such that the chip paddle does not interfere with the plurality of bonding pads.

11. The method as set forth in claim 10, wherein the securing of the adhering surface of the chip paddle comprises securing the chip paddle with a non-conducting adhesive.

12. The method as set forth in claim 10, wherein:
   the providing of a first electrical component comprises forming wire-connecting surfaces and mounting surfaces on the first inner lead portions; and
   the method further comprises providing a plurality of wires, and disposing the plurality of wires to connect pads of the plurality of bonding pads to wire-connecting surfaces of the first inner lead portions.

13. The method as set forth in claim 12, further comprising encapsulating the active surface of the chip, the plurality of wires, the bonding pads, the adhering surface of the chip paddle, and the wire-connecting surfaces of the first inner lead portions in molding resin such that the non-active surface of the chip, the non-adhering surface of the chip paddle, and the mounting surfaces of the first leads are exposed.

14. The method as set forth in claim 10, wherein the stacking comprises placing the second inner lead portions in contact with the first inner lead portions and the method further comprises:
   providing a third electrical component including third leads having third inner lead portions and third outer lead portions; and
   stacking the third electrical component on the second electrical component by placing the third outer lead portions in contact with the second outer lead portions.

15. The method as set forth in claim 14, the method further comprising:
   providing a fourth electrical component including fourth leads having fourth inner lead portions and fourth outer lead portions; and
   stacking the fourth electrical component on the third electrical component by placing the fourth inner lead portions in contact with the third inner lead portions.

16. The method as set forth in claim 10, wherein the stacking comprises placing the second outer lead portions in contact with the first outer lead portions and the method further comprises:
   providing a third electrical component including third leads having third inner lead portions and third outer lead portions; and
   stacking the third electrical component on the second electrical component by placing the third inner lead portions in contact with the second inner lead portions.

17. The method as set forth in claim 16, the method further comprising:
   providing a fourth electrical component including fourth leads having fourth inner lead portions and fourth outer lead portions; and
   stacking the fourth electrical component on the third electrical component by placing the fourth outer lead portions in contact with the third outer lead portions.

18. A method of stacking at least a first electrical component and a second electrical component, comprising:
   providing a first electrical component including first leads having first inner lead portions and first outer lead portions;
   providing a second electrical component including second leads having second inner lead portions and second outer lead portions;
   stacking the second electrical component on the first electrical component by one of placing the second inner lead portions in contact with the first inner lead portions and placing the second outer lead portions in contact with the first outer lead portions
   wherein the providing of a first electrical component comprises:
      providing a first chip having a first active surface and an opposing first non-active surface, the first active surface comprising a central area and a peripheral area having a first plurality of bonding pads;
      forming a leadframe having the first leads disposed at a periphery thereof, the leadframe including a chip paddle having a first adhering surface and a second adhering surface;
      providing a second chip having a second active surface and an opposing second non-active surface, the second active surface having a second plurality of bonding pads;
      attaching the first adhering surface of the chip paddle to the first active surface such that the chip paddle does not interfere with the first plurality of bonding pads; and attaching the second adhering surface of the chip paddle to the second non-active surface.

19. The method as set forth in claim 18, wherein:

the attaching of the first adhering surface of the chip paddle to the first active surface comprises attaching the first adhering surface of the chip paddle using a non-conductive adhesive; and the attaching of the second adhering surface of the chip paddle to the second non-active surface comprises attaching the second adhering surface of the chip paddle using a non-conductive adhesive.

20. The method as set forth in claim 19, wherein:

the providing of a first electrical component comprises forming wire-connecting surfaces and mounting surfaces on the first inner lead portions; and the attaching of the first adhering surface is followed by electrically connecting a first plurality of wires to the first plurality of bonding pads and the wire-connecting surfaces of certain ones of the first inner lead portions; and the attaching of the second adhering surface is followed by electrically connecting a second plurality of wires to the second plurality of bonding pads and the wire-connecting surfaces of other ones of the first inner lead portions.

21. The method as set forth in claim 20, further comprising encapsulating the chip paddle, the second chip, the first active surface of the first chip, the first and second pluralities of wires, and the wire-connecting surfaces of the first inner lead portions such that the non wire-connecting surfaces of the first inner lead portions and the first non-active surface of the first chip are exposed.

* * * * *